United States Patent [19]

Deckard

[11] Patent Number: 5,309,102
[45] Date of Patent: May 3, 1994

[54] FREQUENCY CALIBRATION FOR MRI SCANNER

[75] Inventor: Todd W. Deckard, Milwaukee, Wis.

[73] Assignee: General Electric Company, Milwaukee, Wis.

[21] Appl. No.: 60,435

[22] Filed: May 7, 1993

[51] Int. Cl.$^5$ .............................................. G01V 3/00
[52] U.S. Cl. ....................................... 324/314; 324/313
[58] Field of Search ............... 324/314, 313, 312, 318, 324/322, 307, 309; 128/653.5

[56] References Cited

U.S. PATENT DOCUMENTS

| | | | |
|---|---|---|---|
| 4,788,501 | 11/1988 | LeRoux et al. | 324/314 |
| 4,806,866 | 2/1989 | Maier | 324/313 |
| 4,866,386 | 9/1989 | Sattin | 324/314 |
| 4,952,877 | 8/1990 | Stormont et al. | 324/307 |
| 5,107,215 | 4/1992 | Schaefer et al. | 324/313 |

*Primary Examiner*—Louis Arana
*Attorney, Agent, or Firm*—Quarles & Brady

[57] ABSTRACT

An NMR scanner performs a prescan before each NMR scan sequence in which the optimal RF excitation frequency is automatically determined and applied to the scanner's transceiver. The prescan sequence includes a pair of NMR measurements which provide data that allows the precise RF excitation frequency to be determined.

5 Claims, 6 Drawing Sheets

FREQUENCY CALIBRATION FOR MRI SCANNER

BACKGROUND OF THE INVENTION

This invention relates to magnetic resonance (NMR) techniques. More specifically, this invention relates to the automatic adjustment of the RF transmitter and receiver to the optimal Larmor frequency.

The magnetic resonance phenomenon has been utilized in the past in high resolution magnetic resonance spectroscopy to analyze the structure of chemical compositions. More recently, NMR has been developed as a medical diagnostic modality having applications in imaging the anatomy, as well as in performing in vivo, noninvasive spectroscopic analysis. As is now well known, the NMR phenomenon can be excited within a sample object, such as a human patient, positioned in a homogeneous polarizing magnetic field, $B_0$, by irradiating the object with radio frequency (RF) energy at the Larmor frequency. In medical diagnostic applications, this is typically accomplished by positioning the patient to be examined in the field of an RF coil having a cylindrical geometry, and energizing the RF coil with an RF power amplifier. Upon cessation of the RF excitation, the same or a different RF coil is used to detect the NMR signals, frequently in the form of spin echoes, emanating from the patient lying within the field of the RF coil. In the course of a complete NMR scan, a plurality of NMR signals are typically observed. The NMR signals are used to derive NMR imaging or spectroscopic information about the patient being imaged or studied.

Before the commencement of each NMR scan, it is common practice to adjust the frequency of the RF transmitter and receiver to insure that the excitation field is at the optimal Larmor frequency. This is necessary to produce the desired image contrast effects in certain NMR measurements and to insure the accuracy of slice selection location. In a human subject, for example, the NMR signal is produced primarily by the protons in water and fat molecules. The Larmor frequency of the protons in these two substances is slightly different and the Larmor frequency of both will vary slightly from patient to patient and at different locations within a patient due to inhomogeneities. In prior NMR scanners, it is common practice to perform a calibration sequence in which an NMR sequence is first executed and the NMR signal is processed to produce on a CRT screen a picture of signal amplitude versus RF frequency. The operator then examines this picture and manually adjusts the frequency of the RF receiver to desired value. For example, the displayed NMR signal may show two peaks, one at the Larmor frequency for fat protons and one at the Larmor frequency for water protons. The operator may choose either frequency, or a frequency therebetween, depending on the particular NMR measurement to be conducted.

A method for automatically calibrating the RF frequency of an MRI scanner is described in U.S. Pat. No. 4,806,866. In this method an NMR signal is acquired from the region of interest and transformed to the frequency domain where the two peaks for fat and water are found by filtering the power spectrum signal and identifying peaks which are spaced apart the proper amount. All peaks are identified by taking the first derivative of the filtered power spectrum and searching for points where the derivative is zero. This method has worked well in most applications to automatically set the MRI scanner frequency to the precise Larmor frequency of fat or water, or to a frequency therebetween, such as the midpoint or certroid. However, it has been discovered that in some applications this method routinely finds the wrong peaks in the filtered power spectrum and does not accurately set the MRI scanner to the proper RF frequency. As a result, the images produced by pulse sequences that are particularly sensitive to RF excitation frequency are unsatisfactory, and the contrast characteristics of images produced with other pulse sequences are varied.

SUMMARY OF THE INVENTION

The present invention is an improvement to an NMR scanner in which the adjustment of RF frequency is made automatically during a sequence performed just prior to each NMR scan. More specifically, NMR scanner performs a first, wideband NMR measurement in which the frequency of the highest peak in the NMR signal is determined at the region of interest in the subject, the RF transmit and receive frequencies are set to this determined frequency, a second, narrowband NMR measurement is made to obtain a second NMR signal from the region of interest, the NMR signal is analyzed to determine the frequencies of the fat and water peaks therein by transforming the NMR signal to the frequency domain, correlating the transformed NMR signal with a correlation model of the fat and water peaks to produce a correlation frequency, locating the water peak frequency to one side of the correlation frequency and locating the fat peak frequency to the other side of the correlation frequency, and the frequency of the RF transmitter and RF receiver is set with respect to these determined frequencies.

A general object of the invention is to improve the accuracy of the RF frequency calibration of an NMR system. The correlation model is an idealized representation of the fat and water peaks that should be present in the transformed NMR signal. The correlation process "slides" this model over the NMR signal spectrum and locates the frequency where it fits best. The water and fat peaks should be located on opposite sides of this correlation frequency at one half the chemical shift expected between the fat and water peaks. This technique improves performance particularly well when the NMR signal spectrum has many candidate peaks, since the correlation process picks out the pair of peak candidates which matches best to the expected spectrum.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
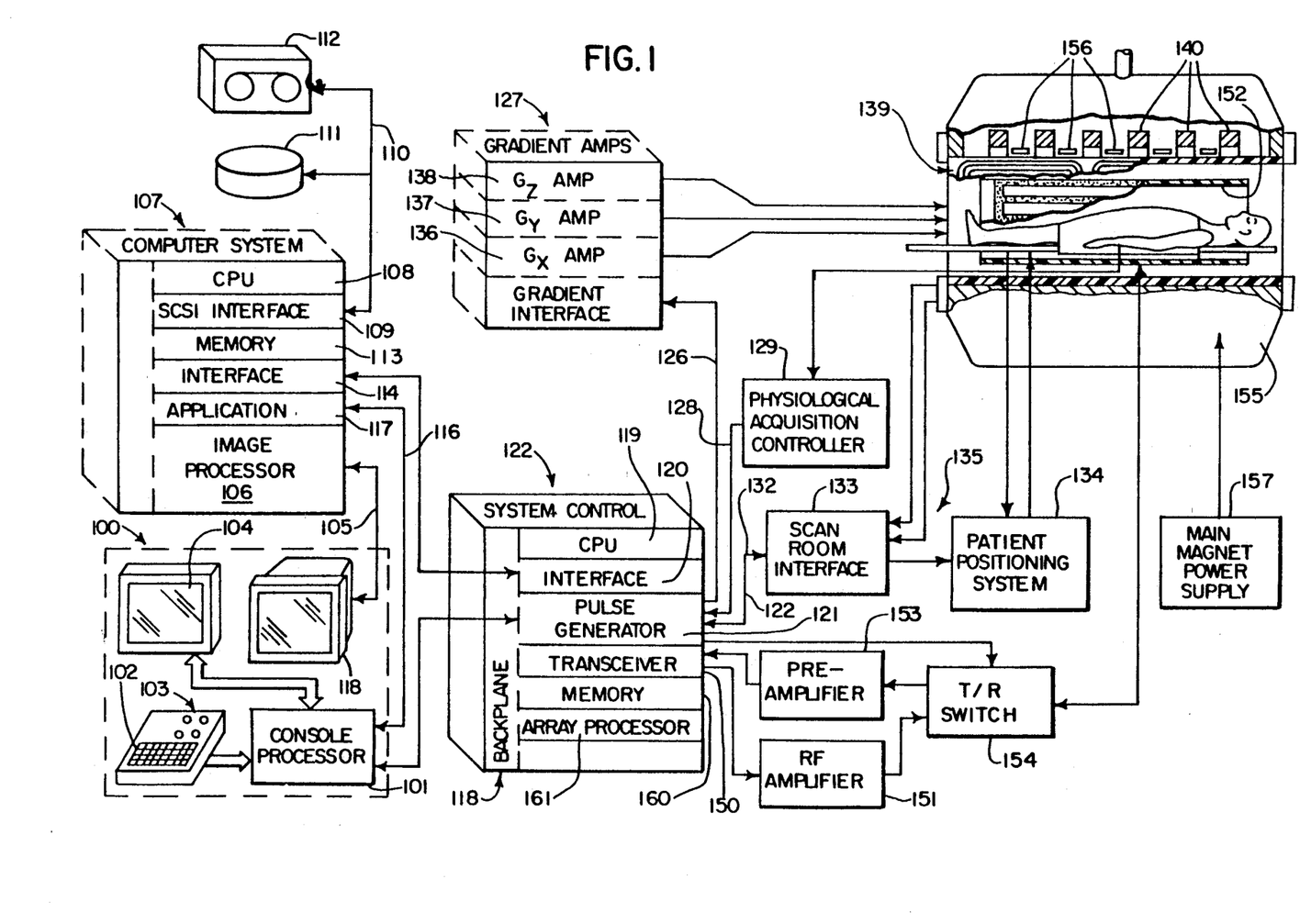
FIG. 1 is a block diagram of an NMR system which employs the present invention.

Referring first to FIG. 1, there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 is formed about a backplane bus which conforms with the VME standards, and it includes a number of modules which communicate with each other through this backplane. In addition to the application interface 117 and the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces either a 0.5 or a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, the magnetic field at any point (x,y,z) in the bore of the magnet assembly 141 is given by $B(x,y,z) = B_0 + G_x X + G_y Y G_z Z$. The gradient magnetic fields are utilized to encode spatial information into the NMR signals emanating from the patient being scanned.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil 152 are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118.

Figure 2:
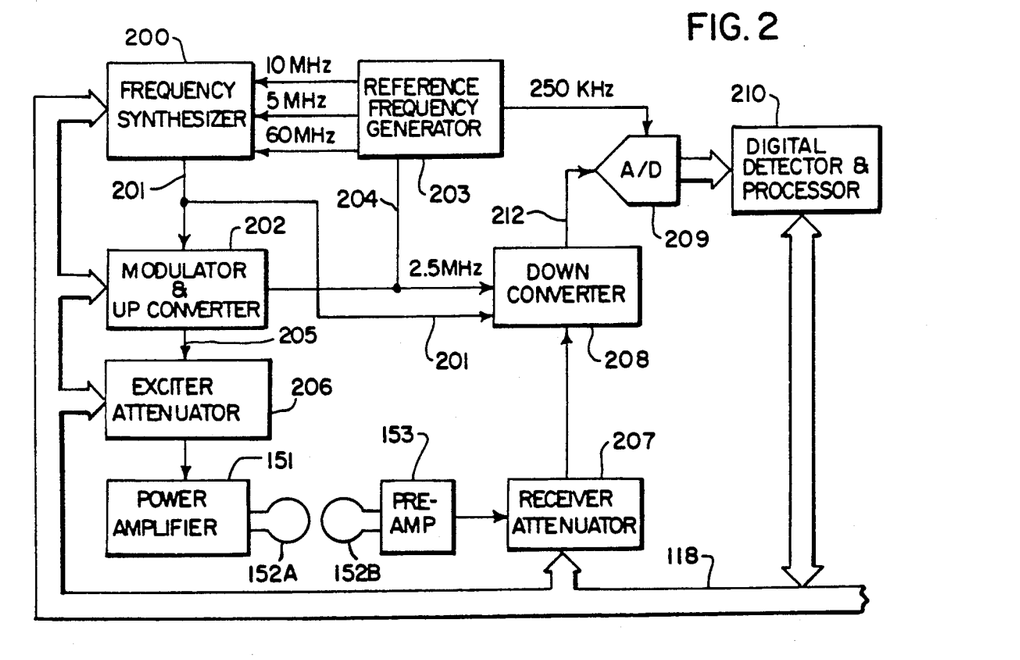
FIG. 2 is an electrical block diagram of the transceiver which forms part of the NMR system of FIG. 1.

Referring particularly to FIGS. 1 and 2, the transceiver 150 includes components which produce the RF excitation field $B_1$ through power amplifier 151 at a coil 152A and components which receive the resulting NMR signal induced in a coil 152B. As indicated above, the coils 152A and B may be separate as shown in FIG. 2, or they may be a single whole-body coil as shown in FIG. 1. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The modulator and up converter 202 produces an RF pulse at the desired Larmor frequency at an output 205.

The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2, the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation.

The received NMR signal is at or around the Larmor frequency, which in the preferred embodiment is around 63.86 MHz for 1.5 Tesla and 21.28 MHz for 0.5 Tesla. This high frequency signal is down converted in a two step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

The present invention relates to the automatic adjustment of the RF carrier frequency produced by the synthesizer 200 in the transceiver 150. This RF frequency must be precisely set in order to provide optimal results from the NMR scanner. The optimal RF frequency usually changes from scan to scan, and the present invention is implemented routinely at the beginning of each scan as part of a "prescan" sequence in which other system parameters are also adjusted, or calibrated. One such adjustment, for example, is described in U.S. Pat. No. 5,107,215 which is entitled "RF Power Calibration For An NMR Scanner". The prescan sequence is executed by the main computer 107 in response to a set of stored program instructions and it produces the digital signals CF, TA and RA which are employed to operate the transceiver 150 as described above.

Figure 3:
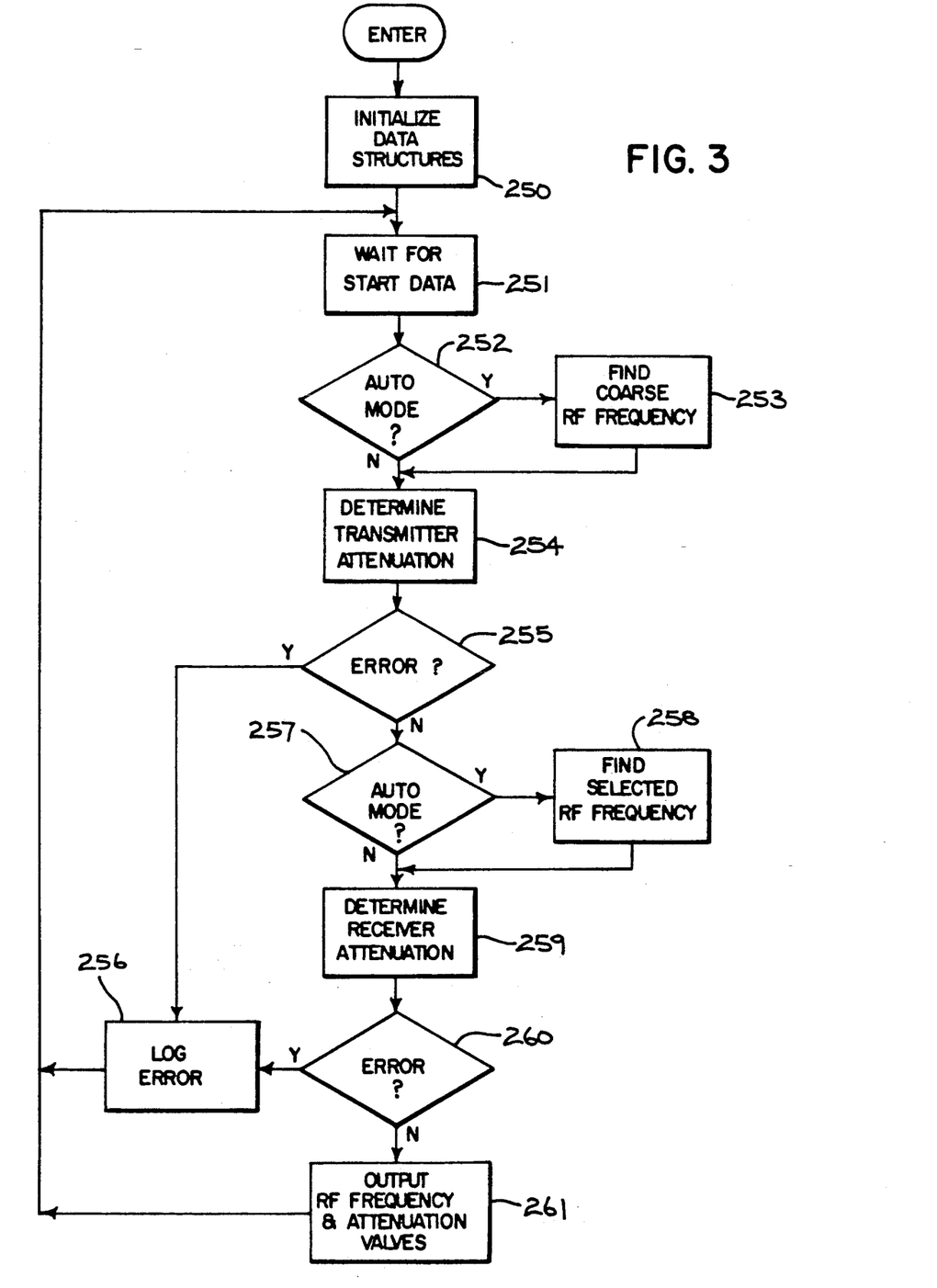
FIG. 3 is a flow chart of the prescan program which is executed NMR system of FIG. 1.

Referring to FIG. 3, the prescan sequence is entered and the various data structures which it requires are initialized as indicated at process block 250. A loop is then entered at process block 251 in which the prescan waits for a signal from the main scan program. The main scan program provides data to the prescan, such as the operator's criteria for center frequency selection. A test is then made at decision block 252 to determine if the operator has chosen the automatic frequency adjust mode of operation. If not, the prescan continues to perform its other functions and it is presumed that the operator is satisfied with the current frequency setting or intends to manually adjust the RF frequency after the automatic prescan and prior to the scan. Otherwise, a first, broadband, NMR measurement is performed to coarsely determine the proper RF frequency as indicated by process block 253. As will be explained in more detail below, this measurement employs the NMR signal to detect the frequency of its peak amplitude and this frequency is output ($CF_1$) to the transceiver 150. The optimal transmitter attenuation (TA) is then calculated at process block 254 in accordance with the teachings in the above-cited U.S. patent. If either the carrier frequency ($CF_1$) or the transmitter attenuation (TA) cannot be determined automatically, this is detected at decision block 255 and the process branches to log the error at 256 for display to the operator.

Referring still to FIG. 3, if the automatic frequency adjustment mode has been selected, the system branches at decision block 251 and a second, narrowband, NMR measurement is performed at process block 258 to determine the exact RF frequency setting ($CF_2$). As will be explained in more detail below, this second measurement and the subsequent analysis of the NMR signal employs data which has been input by the operator through the console (FIG. 1). More specifically, the RF frequency may be set to any one of the following frequencies:

WATER—the Larmor frequency of the nuclei associated with water molecules;

FAT—the Larmor frequency of the nuclei associated with fat molecules;

MIDPOINT—a frequency midway between the WATER and FAT Larmor frequencies;

PEAK—the frequency which produces the largest peak in the transformed NMR signal; and CENTROID—weighted center frequency of the transformed NMR signal.

After determining one of these selected frequencies the prescan process determines at process block 259 the receiver attenuation setting (RA). If either $CF_2$ or RA cannot be determined, the system branches at decision block 260 to indicate an error. Otherwise, the main computer outputs the calculated values $CF_2$, TA and RA to the transceiver 150 as indicated at 261. The prescan process then loops back to block 251 and waits for another call from the main scan program. Of course, the main scan program now proceeds to perform the programmed scan with the transceiver 150 finely tuned to the selected RF frequency.

The determination of the optimal RF frequency for the particular scan to be performed requires the execution of two NMR measurements. The first of these is illustrated by the pulse sequence in FIG. 4 which is executed as part of the procedure for finding the coarse frequency $CF_1$. The second NMR measurement is illustrated by the pulse sequence in FIG. 5 which is executed as part of the procedure for finding the exact RF frequency $CF_2$. These pulse sequences are orchestrated in the standard manner by the pulse generator 121 (FIG. 1) under the direction of the prescan program as described above.

Figure 4:
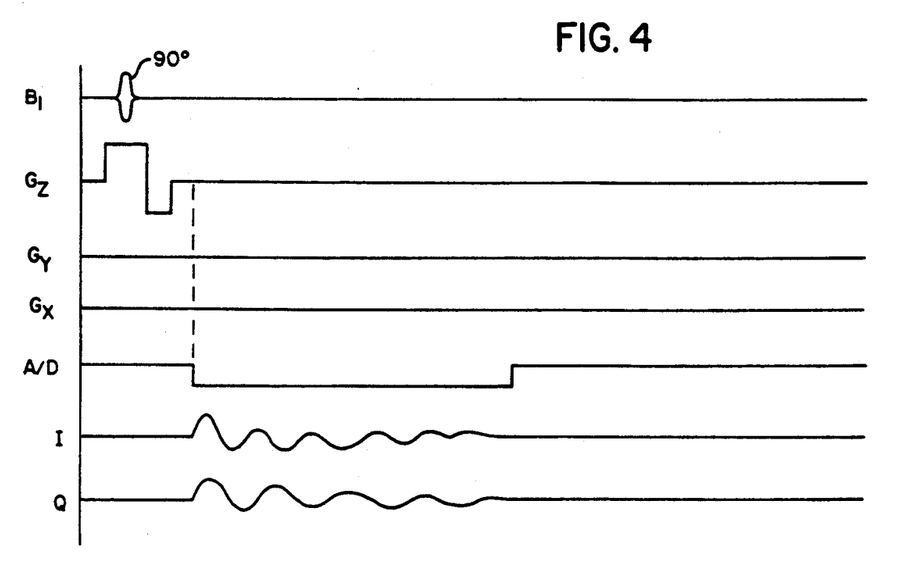
FIG. 4 is a graphic illustration on an NMR measurement pulse sequence which is performed as part of the prescan.
Figure 6:
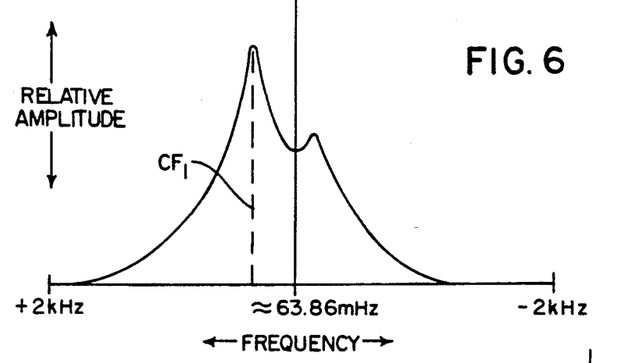
FIG. 6 is a graphic illustration of a transformed NMR signal which results from the NMR measurement of FIG. 4.

Referring to FIG. 4, the coarse pulse sequence begins by exciting the spins in a selected slice through the center of the region of interest. This is accomplished in standard fashion with a 90° excitation pulse produced while a gradient $G_z$ is applied. The $G_z$ gradient is then reversed to rephase the spins and the A/D converter is enabled to acquire the NMR signal. This signal is demodulated and its quadrature phases I and Q are acquired. In the preferred embodiment the signals I and Q are digitized at a 4 kHz sampling rate and 256 samples are acquired. These samples represent the magnitude of the components of the NMR signal as a function of time and they are stored in the computer system as a file $S(t) = S_I(t) + jS_q(t)$. Together these signals also indicate the phase of the NMR signal. The file $S(t)$ is then transformed to the frequency domain using a fast-Fourier transformation of the complex data. The transformed data is stored as a file $F(f) = F_i(f) + jF_q(f)$. The magnitude of the transformed signal $F_f$ is then calculated:

$$|F(f)| = \sqrt{F_i^2(f) + F_q^2(f)}$$

and the resulting transformed signal $|F(f)|$ is smoothed by digitally filtering out higher frequency components as disclosed in "Numerical Recipes" by William H. Press et al. and published in 1986 by Cambridge University Press, pp. 495-497. This transformed signal is graphically represented in FIG. 6, although it can be appreciated that the precise shape of this waveform will differ with each NMR measurement.

Referring particularly to FIG. 6, the transformed NMR signal is now analyzed to determine the frequency of the highest peak. This is accomplished by taking the derivative of the transformed NMR $|F(f)|$ signal and identifying those frequencies at which the derivative changes from a positive to negative sign. The magnitude of the signal is then measured at each of these frequencies to determine the frequency of the highest peak. The frequency is returned as the first pass, or coarse, RF frequency $CF_1$ which is output to the transceiver 150. The RF frequency has now been set so that a higher resolution NMR measurement can be performed during the second pass.

Figure 5:
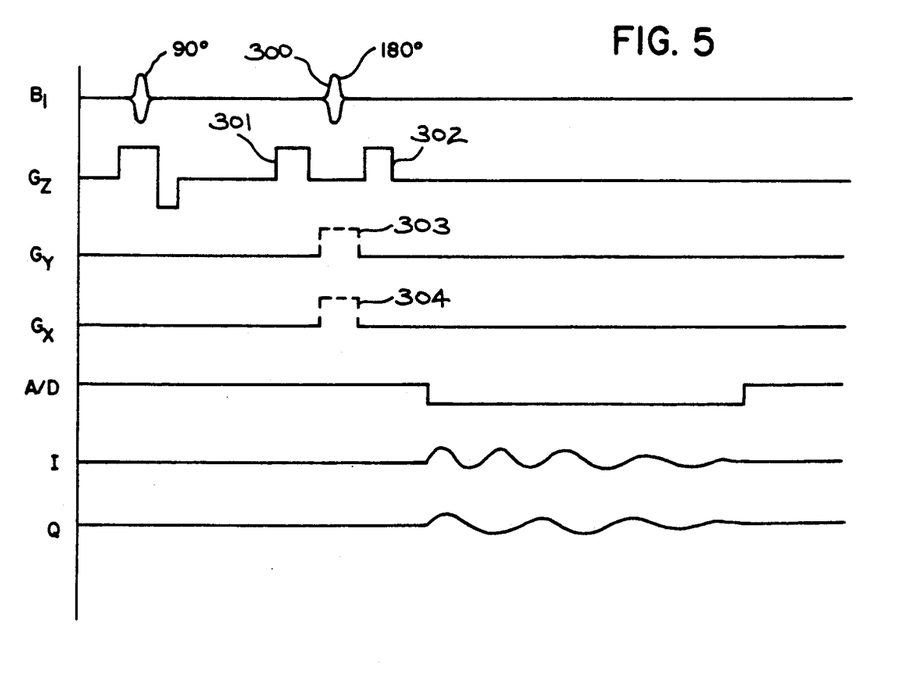
FIG. 5 is a graphic illustration of a second NMR measurement pulse sequence which is performed as part of the prescan.

The pulse sequence for the second NMR measurement which is performed during the second pass adjustment of the RF frequency is shown in FIG. 5. In addition to a slight change in the RF frequency of the excitation field $B_1$ as a result of the first pass adjustment, a number of other differences exist in this second NMR measurement. After the selected slice is excited and rephased by the ninety degree $B_1$ pulse and the $G_z$ pulses, the excited spins are tipped 180° by a second excitation pulse 300 which is produced midway between two $G_z$ gradient pulses 301 and 302. As a result, when the A/D converter is subsequently turned on the NMR signal which is acquired is an echo pulse. In addition, by applying gradient pulses in either the Y or X direction as indicated at 303 and 304, this NMR signal can be further position encoded to a specific region within the selected slice. This is particularly useful where there is considerable tissue in the selected slice along one of these axes, but outside the region of interest. If not eliminated by position encoding, such tissue will effect the NMR signal and may result in a less than optimal RF frequency for the NMR scan of the region of interest. Because these position encoding gradient pulses are optional, they are indicated by dashed lines in FIG. 5, however, the system does automatically apply position encoding gradient pulses along the dimension thought to have the most tissue.

During the second NMR measurement the I and Q signals are sampled and digitized at a 1 kHz sample rate by the analog to digital converter 209 (FIG. 2). Two hundred and fifty-six such digitized samples are obtained and are processed as described above to produce a file $|F(f)|$ containing the magnitude of the transformed and filtered NMR signal. The graphic representation of this transformed NMR signal is shown in FIG. 7 and it can be seen that because of the lower sampling rate a much narrower frequency range is covered.

Figure 8:
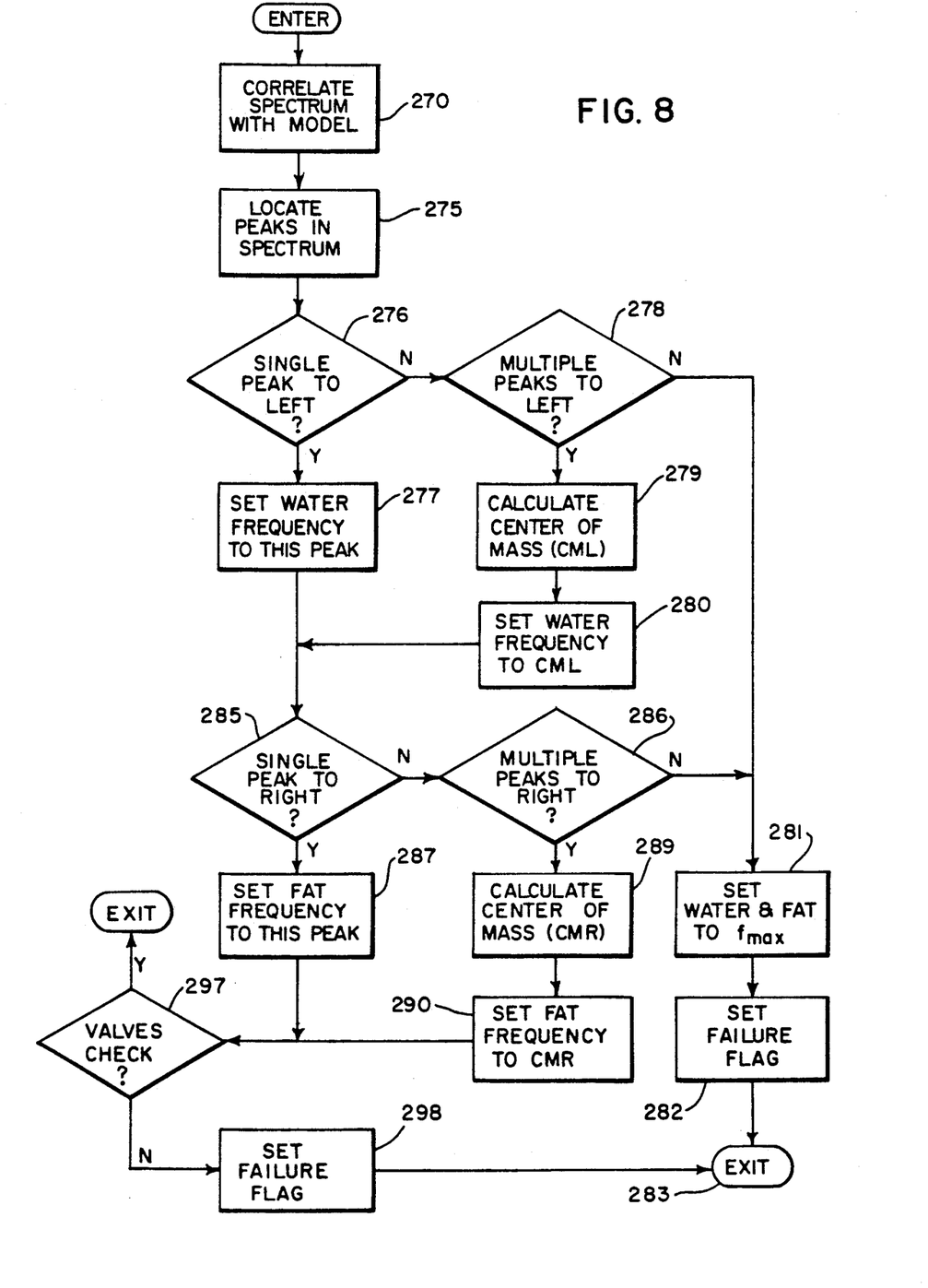
FIG. 8 is a flow chart showing in more detail a portion of the prescan program of FIG. 3.
Figure 9:
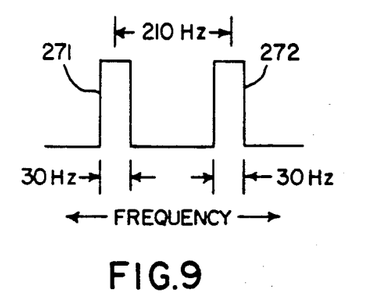
FIG. 9 is a graphic representation of the preferred correlation used in the prescan program of FIG. 8.

Referring particularly to FIG. 8, the transformed NMR signal is now analyzed to determine the optimal selected RF frequency. The first step in this process is to correlate the transformed NMR signal with a correlation model as indicated at process block 270. The correlation model is shown in FIG. 9 and is comprised of two pulses 271 and 272 which are separated in frequency by an amount which corresponds to the chemical shift between water and fat in the particular NMR system being used. In the 1.5 Tesla NMR system of the preferred embodiment the spacing between pulses 271 and 272 is 210 Hertz and each pulse 271 and 272 is 30 Hertz wide. The correlation model is a simplified and idealized signal representing the two peaks produced by fat and water.

Figure 7:
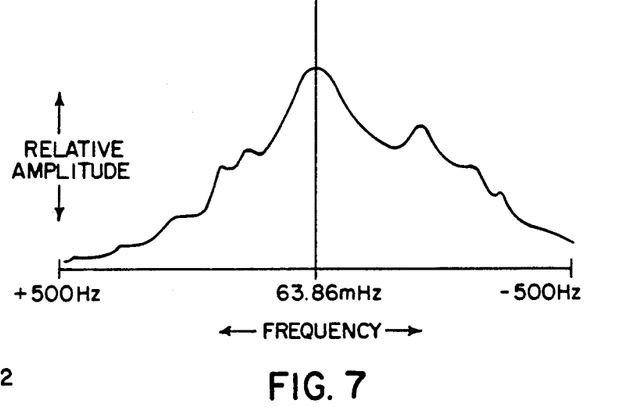
FIG. 7 is a graphic illustration of a transformed NMR signal which results from the NMR measurement of FIG. 5.
Figure 10:
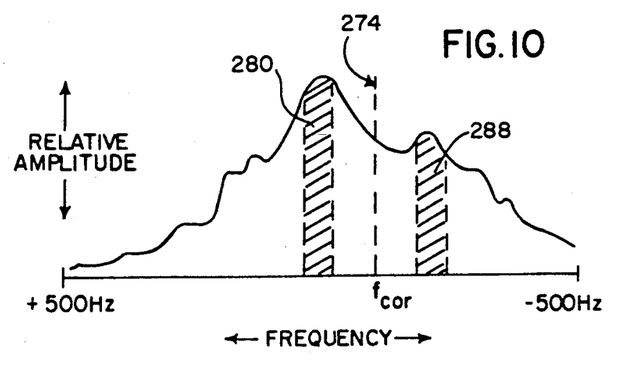
FIG. 10 is a graphic representation of the transformed NMR signal of FIG. 7 illustrating the process carried out by the program of FIG. 8.

The correlation is performed by convolving the correlation model of FIG. 9 with the NMR signal spectrum $|F(f)|$ of FIG. 7. The correlation model is positioned with the pulse 271 at the left end (i.e. +500 Hz) of the NMR signal spectrum, and the corresponding frequency bins of each waveform are multiplied and then summed. Be setting the magnitudes of the pulses 271 and 272 to "1" this step is simplified to merely adding up the magnitudes of the NMR signal spectrum "under" each pulse 271 and 272. The correlation model is then moved to the right one frequency bin and the convolution step is repeated. This continues until the righthand pulse 272 of the correlation model reaches the last frequency bin on the righthand end of the NMR signal spectrum (i.e. −500 Hz). The largest value produced by this series of convolutions is the best correlation and the corresponding frequency ($f_{cor}$) of this maximum value is produced at process block 270. This result is shown in FIG. 10 by the dashed line 274.

Referring again to FIG. 8, the peaks in the NMR signal spectrum $|F(f)|$ are now located as indicated at process block 275. This is accomplished by taking the derivative of the stored signal $|F(f)|$ and identifying the frequencies at which the derivative changes from plus to minus. As indicated at decision block 276, the peaks located to the left of the correlation frequency $f_{cor}$ are candidates for the water peak, and if there is only one of them, then the WATER frequency is set to the frequency of this single peak as indicated at process block 277. If there are multiple peaks to the left of the correlation frequency f©or as determined at decision block 278, then the WATER frequency must be calculated. As indicated by process block 179 and shown by area 280 in FIG. 10, the center of mass of the $|F(f)|$ values in a region of 30 Hz centered at a frequency of 105 Hz to the left of the correlation frequency $f_{cor}$ is calculated. This is determined by numerically integrating across the region 280 until the accumulated area is equal to one-half the total area of the region 280. The WATER frequency is set to this value as indicated by process block 280.

On the otherhand, if no peaks are found to the left of the correlation frequency $f_{cor}$, then the automatic analysis is considered a failure and both the FAT and WATER frequencies are set to the frequency value $f_{max}$ at which the NMR signal spectrum $|F(f)|$ is maximum, as indicated at process block 281. A failure flag is set at 282 to alert the operator of the failure and the process exits at 283.

Referring still to FIG. 8, if a water peak is found, the system searches for a fat peak to the right of the correlation frequency $f_{cor}$ as indicated at decision blocks 285 and 286. If a Single peak is present, the WATER frequency is set to this peak's frequency as indicated at process block 287. If multiple peaks are found, the center of mass calculation is made in the region 288 of FIG. 10 to produce a frequency CMR as indicated at process block 289. This calculation is the same as that described above for CML, but a different 30 Hz portion of the spectrum centered 105 Hz to the right of the correlation frequency is used. The FAT frequency is set to this center of mass frequency CMR as indicated at process block 290. As with water, if no peaks are found to the right of the correlation frequency $f_{cor}$, then the values of both FAT and WATER are set to $f_{max}$ at process block 281, and the failure flag is set at process block 282.

Referring still to FIG. 8, if peaks have been found to each side of $f_{cor}$ for both fat and water, a check is made at decision block 297 to determine if they are reasonable. For example, if they are not separated in frequency by the expected chemical shift (i.e. 210 Hz in the preferred embodiment) then the failure flag is set at process block 298 to alert the operator. Also, a failure is indicated if either of the identified peaks has a magnitude less than 10% of the peak value of the NMR spectrum signal $|F(f)|$. If no failures occur, the process exits at 299.

The process of FIG. 8 returns three values, a WATER frequency, a FAT frequency and a failure flag state. The system uses one of these values directly to produce $CF_2$ if either FAT or WATER has been selected by the operator, or they may be used to calculate $CF_2$ if the operator selects the MIDPOINT. The MIDPOINT is simply the frequency midway between the two identified peaks. If the failure flag has been set, the operator is notified and he has the option of manually changing the frequency that has been returned.

I claim:

1. A method for automatically adjusting the RF frequency of a transceiver in an NMR system, which comprises:
   performing an NMR measurement in which an NMR signal is produced and acquired;
   transforming the acquired NMR signal to the frequency domain;
   defining a correlation model which depicts expected fat and water peaks;
   correlating the correlation model with the transformed NMR signal to produce a correlation frequency ($f_{cor}$);
   locating the peaks in the transformed NMR signal;
   selecting one of the located peaks positioned to one side of the correlation frequency ($f_{cor}$) as the Larmor frequency of water;
   selecting one of the located peaks positioned to the other side of the correlation frequency ($f_{cor}$) as the Larmor frequency of fat; and outputting to the transceiver on the NMR system an RF frequency command (CF) which is based on the determined water or fat Larmor frequency.

2. The method as recited in claim 1 which includes filtering the acquired NMR signal.

3. The method as recited in claim 1 in which the correlation model depicts two pulses separated by the chemical shift frequency of fat and water expected on the NMR system.

4. The method as recited in claim 1 in which the two selected peaks are located within predetermined regions spaced one-half the chemical shift frequency of fat and water to either side of the correlation frequency.

5. The method as recited in claim 4 in which one of the selected peaks is located by calculating the center of mass of the transformed NMR signal within one of said regions.

* * * * *